United States Patent [19]
Henrichs et al.

[11] Patent Number: 5,247,468
[45] Date of Patent: Sep. 21, 1993

[54] SYSTEM FOR CALCULATING AND DISPLAYING USER-DEFINED OUTPUT PARAMETERS DESCRIBING BEHAVIOR OF SUBCIRCUITS OF A SIMULATED CIRCUIT

[75] Inventors: Dale K. Henrichs, Beaverton; Patrick A. Quinn, Aloha, both of Oreg.

[73] Assignee: Tektronix, Inc., Wilsonville, Oreg.

[21] Appl. No.: 249,912

[22] Filed: Sep. 27, 1988

[51] Int. Cl.$^5$ .............................................. G06F 15/00
[52] U.S. Cl. ...................................... 364/578; 395/500
[58] Field of Search ........................... 364/578; 371/23; 324/73 AT

[56] References Cited
U.S. PATENT DOCUMENTS

| | | | |
|---|---|---|---|
| 4,484,266 | 11/1984 | Becker et al. | 364/900 X |
| 4,506,324 | 3/1985 | Healy | 364/200 |
| 4,527,249 | 7/1985 | Van Brunt | 364/578 |
| 4,725,970 | 2/1988 | Burrows et al. | 364/578 |
| 4,782,440 | 11/1988 | Nomizu et al. | 364/578 |
| 4,791,593 | 12/1988 | Hennion | 364/578 |
| 4,827,427 | 5/1989 | Hyduke | 364/578 |
| 4,996,659 | 2/1991 | Yamaguchi et al. | 364/578 X |

Primary Examiner—Joseph L. Dixon
Attorney, Agent, or Firm—Boulden G. Griffith; John P. Dellett

[57] ABSTRACT

An improved circuit simulator interface permits a user to define one or more output parameters describing behavior of hierarchically-defined subcircuits of a circuit. The user defines each output parameter by a hierarchial expression including one or more primitive output parameters generated by a simulator when simulating the circuit or other user-defined output parameters describing behavior of subcircuits of the circuit. Once the circuit simulator has simulated the circuit and has generated the primitive output parameter values, the simulator interface responds to a user request to display the value of a selected user-defined output parameter by decomposing the hierarchical parameter expression defining the selected output parameter to an expression combining only primitive parameter values. The simulator interface then evaluates the decomposed expression using primitive parameter values generated by the simulator and displays the result.

9 Claims, 4 Drawing Sheets

```
ib1
ib2
ics
ict
```

```
bi
bpwr
bv
i
pwr
r
tc1
tc2
v
```

```
alpha
betadc
cbx
ccs
cp
ft
gbbc
gbbe
gm
gqbe
ib
ibt
ic
ict
ie
iet
pd
rbb
re
rmu
ro
rpi
vbc
vbct
vbe
vbet
vce
vcet
```

SYSTEM FOR CALCULATING AND DISPLAYING USER-DEFINED OUTPUT PARAMETERS DESCRIBING BEHAVIOR OF SUBCIRCUITS OF A SIMULATED CIRCUIT

BACKGROUND OF THE INVENTION

The present invention relates to a circuit simulator interface for evaluating expressions defining output parameters describing behavior of subcircuits of a simulated circuit, wherein the expressions combine primitive circuit parameter values generated by the simulator.

A "netlist" input to a circuit simulator may describe a circuit to be simulated by identifying primitive electronic devices included in the circuit and indicating how they are interconnected. "Primitive" electronic devices such as resistors, capacitors, inductors and transistors have operating characteristics known to the circuit simulator. Based on the circuit defined by the netlist, and on the known characteristics of the primitive devices forming the circuit, the circuit simulator simulates the operation of the circuit by generating a data file containing various primitive output parameter values describing circuit behavior. The primitive output parameter values may include, for example, voltages at various nodes of primitive devices and currents through branches of the primitive devices.

A circuit simulator may accept an input netlist defining a circuit hierarchically. Portions of a hierarchical netlist may define various subcircuit models formed by primitive electronic devices known to the circuit simulator. Other portions of the netlist may describe models of higher level subcircuits formed b combinations of primitive electronic devices and "instances" of lower level subcircuit models defined elsewhere in the netlist. Before executing a simulation, a circuit simulator automatically decomposes a hierarchical netlist description of a circuit into a single level representation employing only primitive electronic devices.

Although the netlist description may be hierarchically defined, a circuit simulator nonetheless produces primitive output parameter values relating only to primitive devices at the lowest level of circuit definition. But users are often interested in values of certain parameters describing behavior of higher level subcircuits of hierarchically defined circuit, and such parameters may not be directly included in the simulator output. For example, a user may wish to determine an output current produced by an amplifier. When the amplifier is a user-defined subcircuit of primitive devices, the simulator does not generate an output parameter indicating the amplifier output current. However, the amplifier output current is equal to a sum of certain component currents internal to the amplifier and the circuit simulator may provide some of these component currents as primitive output parameter values. However, the user may have to calculate other component currents from primitive parameter values indicating voltage drops across one or more devices of known impedance within the amplifier. Thus, to determine the amplifier output current, the user must determine circuit nodes and branches and impedances of interest, consult the simulator output data to obtain an appropriate set of primitive parameter values, and then perform the necessary calculations. Such a procedure can be tedious, difficult, and subject to error.

SUMMARY OF THE INVENTION

A circuit simulator receives as input a netlist defining a circuit to be simulated as a hierarchy of subcircuits. Subcircuits at a lowest level of the hierarchy are arrangements of interconnected primitive electronic devices, and higher level subcircuits comprise arrangements of primitive electronic devices and lower level subcircuits. "Primitive" electronic devices are devices having operating characteristics known to the simulator. The circuit simulator generates as output a set of "primitive parameter" values representing aspects of the behavior of primitive devices forming the circuit.

In accordance with an aspect of the present invention, an improved circuit simulator interface permits a user to define output parameters associated with subcircuits of a hierarchically-defined circuit. Each output parameter is defined by a hierarchy of expressions mathematically combining various primitive parameter values generated by the circuit simulator. After the simulator has simulated the circuit and produced primitive parameter values, the simulator interface responds to user requests for output parameters values by evaluating user-defined parameters expressions in view of the primitive parameter values produced by the simulator. The simulator interface then displays the result.

Thus, for example, when a circuit to be simulated includes an amplifier subcircuit formed by primitive electronic devices, the user may define an amplifier output current parameter by an expression hierarchy appropriately combining primitive parameter values of devices forming the amplifier subcircuit. After the simulator has simulated the circuit, the user may request the simulator interface automatically to compute and display the amplifier output current.

It is accordingly an object of the present invention to provide an improved circuit simulator interface permitting users to define output parameters representing subcircuit behavior as a combination of primitive parameter values produced by a circuit simulator representing subcircuit component behavior and which evaluates the user-defined output parameters and displays the results following circuit simulation.

The subject matter of the present invention is particularly pointed out and distinctly claimed in the concluding portion of this specification. However, both the organization and method of operation of the invention, together with further advantages and objects thereof, may best be understood by reference to the following description taken with the accompanying drawings wherein like reference characters refer to like elements.

DESCRIPTION OF THE PREFERRED EMBODIMENT

Figure 1:
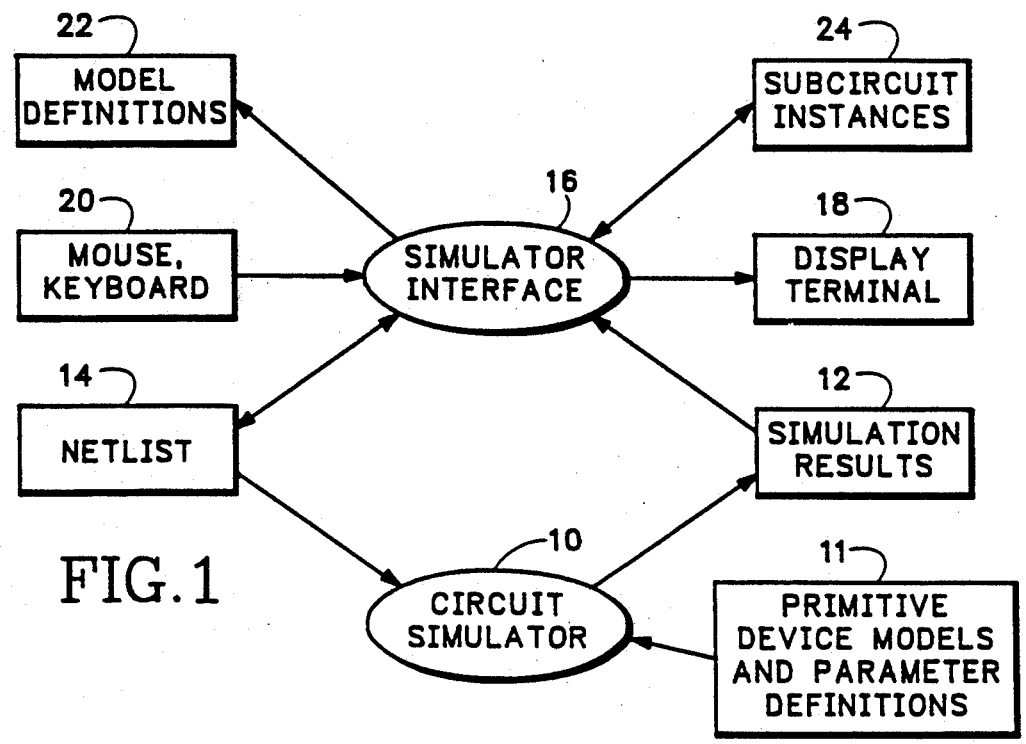
FIG. 1 illustrates data flow between a circuit simulator and a circuit simulator interface system.

Referring to FIG. 1, a prior art circuit simulator 10, a program run on a computer, simulates operation of a circuit formed by interconnected instances of "primitive" electronic devices such as resistors, transistors and the like having operating characteristics indicated by models stored in a data file 11 accessed by simulator 10. Simulator 10 receives as input a hierarchical netlist 14, a data file describing the circuit as an arrangement of interconnected subcircuits and primitive electronic devices. The netlist 14 includes a definition hierarchy defining each subcircuit forming the simulated circuit as an arrangement of interconnected components, each component of a subcircuit being an instance of a primitive electronic device or an instance of another subcircuit defined elsewhere in the netlist.

Simulator 10 produces output simulation results 12, a file containing values of "primitive" parameters representing behavior of primitive devices forming the circuit defined by netlist 14. Simulator 10 computes primitive parameter values based on descriptions of operating characteristics of the primitive devices stored in data file 11 based on how these devices are interconnected by the decomposed netlist, and based on definitions of the output parameters to be computed. The latter definitions are also maintained in data file 11. For a given primitive device, data file 11 may define such output parameters as, for example, voltages at various nodes of the primitive device, current through branches of the device, power dissipated by the device, charges stored by the primitive device, etc.

A simulator interface 16, running on the same or a different computer from the one running circuit simulator 10, permits a user to define a circuit by drawing it on the screen of a display terminal 18 utilizing a mouse or keyboard 20 to input commands. The simulator interface 16 maintains a data file containing a model definition 22 for each circuit or subcircuit defined by the user, and maintains a record 24 cross-referencing each instance of each model included in the definition of another model to its own model definition. A user defines a circuit by selecting, positioning and interconnecting representations of instances of previously defined subcircuit models and primitive devices. When the user selects a subcircuit model from a menu displayed on terminal 18, the simulator interface 16 displays a symbolic representation of an instance of the subcircuit on the screen. The user may then command the simulator interface 16 to move the representation to a desired location and may graphically interconnect its input and output terminals with lines to terminals of other devices represented in the display. Once a user has graphically defined a circuit, he may command the simulator interface to save the circuit as a subcircuit model definition 22. The user may also draw a graphic representation of the circuit for storage as part of model definition. Thereafter, the user may incorporate instances of the newly defined circuit model into another, higher level circuit definition.

Figure 2:
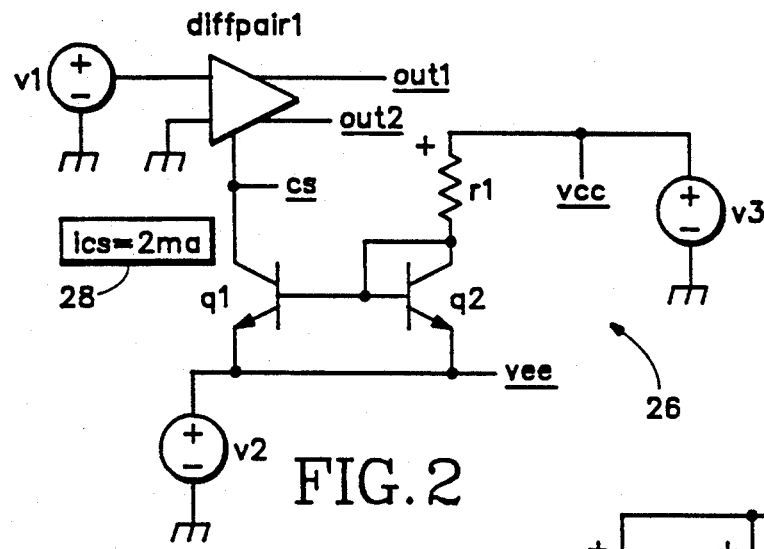
FIG. 2 illustrates a circuit display produced by the circuit simulator interface of FIG. 1.

FIG. 2 illustrates a display of a circuit 26 as might be produced by simulator interface 16 in response to user input. Circuit 26 includes a differential amplifier (diffPair1) having one input driven by a voltage source v1 and another input grounded. A gain control input of amplifier diffPair1 is connected to a collector of a transistor q1. The base of transistor q1 is tied to the base and collector of another transistor q2 and the emitters of transistors q1 and q2 are connected to another voltage source v2. A third voltage source v3 is connected through resistor r1 to the collector of transistor q2. The voltage sources v1, v2 and v3 and resistor r1 are instances of primitive devices known to the circuit simulator. However, the diffpair1 amplifier and the q1 and q2 transistors are instances of subcircuit models previously defined by the user, The instance names v1, v2, v3, diffPair1, q1 and q2 are user-selected. The user has also labeled various nodes in the circuit as "vcc", "vee", "cs", "out1" and "out2".

Figure 3:
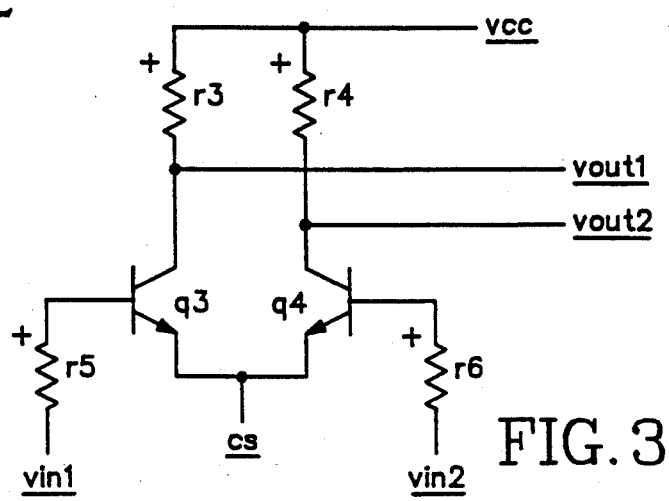
FIG. 3 illustrates a display of a model of a differential amplifier subcircuit of the circuit of FIG. 2 produced by the simulator interface of FIG. 1.

The simulator interface 10 of FIG. 1 permits a user to define subcircuit models hierarchically starting with "primitive" models of basic electronic devices such as resistors, capacitors, transistors and the like having operating characteristics known to the simulator interface. For example, the amplifier instance diffPair1 illustrated in FIG. 2 represents an instance of an amplifier subcircuit model diffPair previously defined by the user. FIG. 3 illustrates a display of the diffPair model produced by the simulator interface in response to user input A labeled node vcc is coupled to collectors of an emitter-coupled pair of transistors q3 and q4 through resistors r3 and r4. A resistor r5 couples input node vin1 to the base of q3 and a resistor r6 couples input node vin2 to the base of q4. The user has labeled the collectors of transistors q3 and q4 as the vout1 and vout2 nodes of the model. Resistors r3–r6 are instances of a resistor model and transistors q3 and q4 are instances of a transistor subcircuit model q defined by the user.

Figures 4, 5, 6, 7:
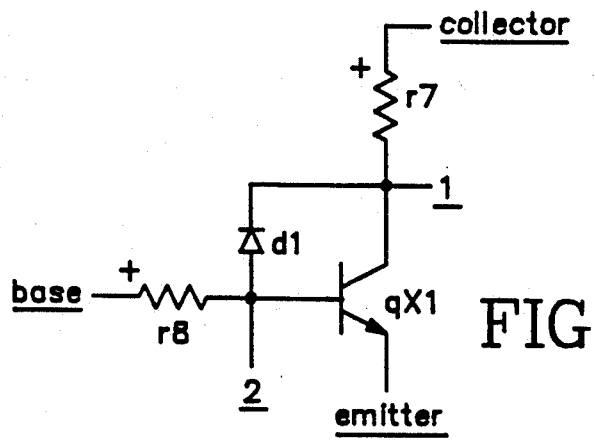
FIG. 4 illustrates a display of a model of transistors q1 and q2 of FIG. 2 produced by the circuit simulator interface of FIG. 1.
FIG. 5 illustrates a pop-up menu listing various user-defined output parameters of a differential amplifier subcircuit model.
FIG. 6 illustrates a pop-up menu listing various user-defined output parameters associated with a resistor model.
FIG. 7 illustrates a pop-up menu listing various user-defined output parameters associated with a transistor model.

FIG. 4 illustrates a display of a subcircuit model q of transistor instances q1 and q2 of FIG. 2 and instances q3 and q4 of FIG. 3. Transistor model q includes an instance qx1 of another transistor model gp2 npn 3. A resistor r7 connects a collector node of subcircuit q to the collector of transistor qx1 and a resistor r8 connects a base node of subcircuit q to the base of transistor qx1. An instance d1 of a diode model d is connected between the collector and base of transistor qx1. The collector and base of transistor qx1 are labeled as nodes "1" and "2" of the transistor q model. The emitter of transistor qx1 is labeled as the "emitter" node of the transistor q model. The user has also labeled free terminals of resistors r7 and r8, respectively, as the "collector" and "base" of the transistor q model.

To create the circuit of FIG. 2, the user may first create the subcircuit model of a transistor q, the arrangement of instances of primitive parameter models illustrated in FIG. 4. The user then commands the simulator interface to store the circuit as subcircuit model q. The user also provides the simulator interface with input indicating a graphic transistor-shaped icon to represent instances of the q transistor model, as for example, the icon representing instance q3 of FIG. 3. The simulator interface stores a description of the icon as part of the definition of the q transistor subcircuit model. The user may then create the diffPair subcircuit of FIG. 3 positioning and interconnecting icons representing instances q3 and q4 of the previously defined transistor model q with instances r3-r6 of the resistor model. The user commands the simulator interface to store the diffPair subcircuit as a model and to subsequently represent instances of the differential pair subcircuit using the triangle-shaped icon illustrated in FIG. 2. Finally, the user draws the circuit of FIG. 2 by interconnecting icons representing instances diffPair1, q1 and q2 of the previously defined diffPair and q subcircuit models and representing instances v1, v2, v3, r1 and r2 of primitive voltage source and resistor models.

Once the user has defined a circuit model, the user may tell the simulator interface 16 of FIG. 1 to generate a netlist describing the circuit so that it may be provided to the circuit simulator 10. The netlist describes the circuit as an arrangement of interconnected instances of subcircuit and primitive device models at a level of detail corresponding to the level of detail shown in FIG. 2. In addition, the netlist includes a subcircuit hierarchy defining each subcircuit forming the circuit as an arrangement of interconnected components, each component of a subcircuit being either an instance of a primitive electronic device or an instance of another subcircuit defined elsewhere in the netlist. Table I is typical of a netlist for the circuit of FIG. 2. (Line numbers inserted in Table I for reference purposes are not included in the netlist.)

TABLE I

| | Circuit Netlist |
|---|---|
| 1. | Circuit |
| 2. | diffPair1 1 0 out1 out2 12 diffPair |
| 3. | v1 1 0 v |
| 4. | v2 vee 0 v |
| 5. | v3 vcc 0 v |
| 6. | q1 12 24 vee q |
| 7. | q2 24 24 vee q |
| 8. | r1 vcc 24 r: r=20k |
| 9. | MODEL gp2_npn_3 gp2: pol=1 |
| 10. | MODEL diffpair SUBCKT : NODES=(vin1 vin2 vout1 vout2 cs ) |
| 11. | q1 vout1 5 cs q |
| 12. | q2 vout2 15 cs q |
| 13. | r5 5 vin1 r: r=1k |
| 14. | r6 15 vin2 r: r=1k |
| 15. | r3 vcc vout1 r: r=10k |
| 16. | r4 vcc vout2 r: r=10k |
| 17. | ENDM diffPair |
| 18. | MODEL q SUBCKT : NODES=(collector base emitter ) |
| 19. | q1 1 2 emitter p2_pn_3 |
| 20. | r8 base 2 r |
| 21. | r7 collector 1 r |
| 22. | d1 1 2 d |
| 23. | ENDM q |
| 24. | globaln vcc vee |

Lines 1-8 describe the circuit to be simulated as an arrangement of interconnected instances of subcircuit and primitive device models diffPair1, v1-v3, q1, q2, and r1. Line 1 marks the start of the netlist for the circuit. Line 2 indicates the circuit includes an instance diffPair1 of the diffPair model, and that the diffPair1 instance has five terminals connected respectively to circuit nodes labeled 1, 0 out1, out2 and 12. The circuit simulator interface automatically generated the unique node labels 1, 0 and 12 since the user did not manually label these nodes. However, the simulator interface retained the user-defined labels out1 and out2. Line 3 of the netlist indicates an instance v1 of the primitive voltage source model v has terminals connected between nodes 1 and 0. Lines 4 and 5 similarly show elements v2 and v3 as additional instances of voltage source model v connected between nodes vee or vcc and 0. Lines 6 and 7 list the various circuit nodes connected to terminals of instances q1 and q2 of a transistor model q. Line 8 references an instance r1 of a model resistor r as being connected between nodes vcc and 24 and indicates the resistor instance has a value of 20 kOhms. (The user previously selected the 20 kOhm value in response to a prompt from the simulator interface when the installing resistor r1 in the diffPair1 model.)

Lines 9-24 describe a subcircuit hierarchy which directly or indirectly defines the model for each subcircuit model instance in the circuit description of lines 1-8 as an arrangement of interconnected instances of primitive devices. Line 9 defines a transistor model gp2_npn_3 as a type of primitive transistor gp2 with a parameter "pol" set equal to 1, thereby indicating transistor gp2_npn_3 is an npn rather than a pnp transistor.

Lines 10-17 define the diffPair subcircuit model. Line 10 lists the node labels vin, in2, vout1, vout2, cs of the model. Lines 11-16 list the various component instances forming the diffPair model and how they are interconnected. For example, line 11 indicates collector, base and emitter terminals of an instance q1 of the transistor subcircuit q are connected to nodes vout1, 5, and cs, respectively. Line 17 marks the end of the diffPair model definition.

Lines 18-23 define the transistor q subcircuit model. Line 18 labels circuit nodes as collector, base and emitter. Lines 19-22 reference the components forming the transistor q model and line 23 indicates the end of the transistor q netlist definition. Line 24 indicates that all nodes labeled vcc are interconnected and that all nodes labeled vee are interconnected.

Before starting the circuit simulation, the circuit simulator 10 of FIG. 1 "decomposes" the hierarchical netlist description of a circuit illustrated in Table I into a single level description of the circuit. The single level description describes the circuit as an arrangement only of primitive electronic devices having characteristics known to the circuit simulator. During simulation, the circuit simulator 10 generates simulation results 12, the record of values of one or more output parameters for each primitive device in the single level model representation. The simulator 10 computes primitive parameter values based on descriptions of operating characteristics of the primitive devices stored in data file 11, based on how these devices are interconnected by the decomposed netlist, and based on definitions of the primitive parameters to be computed. The primitive parameter definitions are also maintained in data file 11. For a given primitive device, data file 11 may define such primitive parameters as voltages at various nodes of the device, currents through branches of the device, power dissipated by the device or component values of the device that may vary with temperature or other circuit condition.

Thus, although the netlist describes the circuit as an arrangement of hierarchically defined subcircuits, the circuit simulator generates and stores in simulation results file 12 output parameter values representing only behavior of primitive devices forming a subcircuit. But users are often interested in values of certain parameters describing behavior of user-defined subcircuits of a simulated circuit, and such parameters are directly available in the simulator output only if they happen to be equivalent to primitive parameter values. In the past, as previously mentioned, users have had to manually calculate subcircuit parameter values from the lower level parameter values in the simulator output.

For example, a user may wish to determine an output current through the "cs" node of the diffPair1 amplifier subcircuit appearing in the netlist description of a circuit being simulated. The user may choose to calculate such output current by adding currents in all circuit branches internal to the diffPair1 amplifier connecting to an amplifier output node. Referring to FIG. 3, the current at the cs node is equal to the sum of currents supplied to the collectors and bases of transistors q3 and q4. The circuit simulator may directly indicate some of these branch currents as primitive parameter values. However, the user must calculate various branch currents from primitive Parameter values indicating voltage drops across one or more devices of known impedance within the amplifier circuit. For example, the user may have to calculate the collector current of transistor q3 by determining the voltage drop across resistor r7 of FIG. 4 from primitive parameter values an dividing it by its resistance. Thus, to determine the output current of an amplifier circuit, the user must determine the circuit nodes and branches of interest, determine primitive parameters of interest, consult the simulator output data to find values of those primitive parameters, and then perform the necessary calculations. As mentioned, such a process can be tedious, difficult, and subject to error.

The present invention relates to an improvement to simulator interface 16 of FIG. 1. The improved simulator interface permits a user to define a set of output parameters associated with each higher level subcircuit. The user defines an output parameter of a particular subcircuit by providing simulator interface 16 with an expression combining output parameters associated with primitive devices or with previously defined lower level subcircuits forming the particular subcircuit. The simulator interface stores the user-defined parameter expressions associated with each subcircuit as a part of model definition 22 of the subcircuit. After the circuit simulator 10 has carried out a circuit simulation in response to a netlist 14 developed by the simulator interface, the simulator interface 16 responds to a user request for display of a user-defined output parameter value associated with a particular subcircuit by evaluating the user-defined parameter expression included in the subcircuit model definition and displaying the result.

To request display of a user-defined output parameter associated with a particular subcircuit, the user points to the subcircuit with a cursor and presses a mouse button. The simulator interface then displays a pop-up menu listing the various output parameters that have been defined for the subcircuit. For example, when the circuit of FIG. 2 is displayed, the user may request output parameter values associated with the diffPair1 amplifier by pointing to diffPair1 with a cursor and depressing a mouse button to generate a menu as illustrated in FIG. 5.

The menu in FIG. 5 lists four user-defined output parameters associated with the diffPair model of FIG. 3. The ib1 parameter is the input current supplied by source v1 into node vin1, and the ib2 is the current input to node vin2. The ics parameter is the amplifier control current supplied to node c2. The ict output parameter is the sum of currents through resistors r3 and r4 of FIG. 3. When the user selects, for example, the ics parameter from the menu, the simulator interface computes the value of the ics control current and displays the result in a small data window 28 as illustrated in FIG. 2. The user can reposition the data window on the circuit display by pointing to the window, depressing a mouse button, "dragging" the window to a desired screen position and releasing the mouse button.

The user may also initiate display of values of output parameters associated with lower level subcircuits. For example, the user may "push" into the model of diffPair1 by pointing to the representation of diffPair1 and clicking a particular mouse button. The simulator interface responds by displaying a representation of the model diffPair of diffPair1 (similar to that illustrated in FIG. 3) in a window superimposed over the top level circuit model of FIG. 2. The user may then select a subcircuit component of the diffPair1 instance (for example, resistor r1) with the cursor and open an output parameter menu on that component. FIG. 6 illustrates such a menu. The output parameters v and i are the swept (DC, AC, transient) voltage across the resistor and the swept current through the resistor. Parameters bv and bi reference DC (bias) voltages and currents of the resistor. The parameter r is its resistance. The pwr and bpwr parameters are the swept and DC power dissipation of the resistor. The parameters tc1 and tc2 are coefficients defining the temperature response of the resistor. When the user selects one of the parameters listed on the menu, the simulator interface computes its value and displays the result in a small window on the screen near the component device whose behavior the parameter represents.

FIG. 7 illustrates a pop-up menu as would be produced When the user selects transistor q3 of FIG. 3 The menu of FIG. 7 lists all user-defined output parameters associated with the circuit model q of FIG. 4, and the user may select one or more of these parameters for computation and display in the manner described hereinabove.

While creating or editing a circuit model, the user may define an output parameter associated with the model by typing an equation as input to the circuit simulator. For example, the equation $$ie = ic + ib \tag{1}$$

defines the output parameter ie (here the emitter current of the transistor q subcircuit model) as the sum of two other previously defined parameters ic and ib (the collector and base currents of the transistor). The simulator interface stores this equation as a part of the transistor q model Thereafter, when the circuit has been simulated and the user requests the simulator interface to display the ie parameter for a particular instance of the q transistor model, the simulator interface computes the ic and ib parameter values for that instance and adds these two values to determine the ie parameter value.

Of course, the user must also define the ic and ib parameter values prior to the circuit simulation and does so by providing the simulator interface with the following equations:

$$ic = \text{output}(r7, bi) \tag{2}$$

$$ib = \text{output}(r8, bi) \tag{3}$$

These equations indicate ic and ib are equal to the values of output parameter bi of resistor instances r7 and r8, respectively. Resistors r7 and r8 are illustrated in the transistor model q of FIG. 4.

It follows that for the simulator interface to compute the values of ic and ib, the user also defines the output parameters bi of the resistor model r of instances r7 and r8. To do so the user inputs the following equations to be stored as a part of the resistor r model:

bi = bv/r  [4]

bv = primitivebv(1)-primitivebv(2)  [5]

r = primitiveparameter(r)  [6]

Equation [4] defines bi as a resistor output parameter bv divided by another resistor output parameter r. Equation [5] defines bv as the difference between two "primitive" bias value parameters (1) and (2), and equation [6] defines the r parameter as equal to a primitive parameter value r. The circuit simulator generates the primitive parameter values r, (1) and (2) for each instance of the resistor model forming the simulated circuit.

Thus, to respond to the user's request to calculate and display the value of the ie parameter associated with transistor q3 of FIG. 3, the simulator interface first parses equation [1] defining ie, and determines it must first find values for ib and ic. It then parses equations [2] and [3] defining ib and ic and finds it must determine values for bi of resistors r7 and r8 before it can calculate ib and ic. For each resistor r7 and r8, the simulator interface parses equation [4] and finds it must determine values of bv and r. Finally, parsing equations [5] and [6], the simulator interface determines bv and r are equal to primitive parameter values stored in the simulator results file 12 of FIG. 1.

The simulator interface then reads the values of primitive parameters (1), (2) and r for resistors r7 and r8 and calculates the value of bv and r for these resistors in accordance with equations [5] and [6]. The simulator interface uses the calculated values to determine values of the bi parameter for each resistor in accordance with equation [4]. With the bi parameters computed, the simulator interface next calculates the values of ib and ic in accordance with equations [2] and [3] and finally combines the values of ib and ic to determine the value of ie in accordance with equation [1]. The value of ie is then displayed in a small window near the representation of transistor q3.

The user provides equations defining output parameters for a model simply by editing the definition file 22 of FIG. 1 associated with the model. For the gp2_npn_3 subcircuit model, the output parameter portion of the definition file may appear as illustrated in Table II.

TABLE II

Example Transistor gp2_npn_2
Output Parameter Definitions rmu = primitiveparameter(rmu) $
cmu = primitiveparameter(cmu) $
ro = primitiveparameter(ro) $
rpi = primitiveparameter(rpi) $
cpi = primitiveparameter(cpi) $
ib = primitiveparameter(ib) $
rbb = primitiveparameter(rbb) $
cbx = primitiveparameter(cbx) $
ibt = primitiveparameter(ibt) $
ic = primitiveparameter(ic) $

TABLE II-continued

Example Transistor gp2_npn_2
Output Parameter Definitions vbc = primitiveparameter(vbd) $
vbe = primitiveparameter(vbe) $
gbbc = primitiveparameter(gbbc) $
gbbe = primitiveparameter(gbbe) $
gqbe = primitiveparameter(gqbe) $
ccs = primitiveparameter(ccs) $
ft = primitiveparameter(ft) $
ict = primitivei(1) pd = vce*ic $
vce = primitiveparameter(vce) $
vbct = primitivei(2)-primitivev(1) $
re = alpha/gm ie = ic+ib iet = primitivei(3) $
vbet = primitivev(2)-primitivev(3) $
vbet = primitivev(1)-primitivev(3) $
betadc = primitiveparameter(betadc) $
alpha = betadc/(betadc+1) $
gm = primitiveparameter(gm)

In a definition file, parameter definition equations are separated by spaces and line ends are indicated by the $ symbol. For the resistor r model, the diffPair subcircuit model, the transistor q subcircuit model, and the diode d model, example output parameter definition files are illustrated in Tables III-VI, respectively.

TABLE III

Example Resistor r
Output Parameter Definitions r = primitiveparameter(r) $
tc2 = primitiveparameter(tc2) $
tc1 = primitiveparameter(tc1) $
bv = primitivev(1)-primitivev(2) $
i = v/r pwr = v*i bi = bv/r bpwr = bv*bi $
v = primitivev(1)-primitivev(2)

TABLE IV

Example diffPair Model
Output Parameter Definitions ib1 = output(r5,bi) $
ib2 = output(r6,bi) $
ics = output(q3,ie)+output(q3,ie) $
ict = output(r3,i)+output(r4,i)

TABLE V

Example Transistor q Model
Output Parameter Definitions rmu = output(qx,rmu) cmu = output(qx,cmu) $
ro = output(qx,ro) rpi = output(qx,rpi) $
cpi = output(qx,cpi) ib = output(r8,ib) $
rbb = output(qx,rbb) cbx = output(qx,cbx) $
ibt = (v(base-v(2))/output(r8.r) $
ic = output(r8,bi) vbc = output(qx,vbc) $
vbe = output(qx,vbe) gbbc - output(qx,bbc) $
gbbe = output(qx,bbe) gqbe = output(qx,gqbe) $
ccs = output(qx,css) ft = output(qx,ft) $
ict = (v(collector)-v(1))/output(r7,r) $
pd = vce*ic vce = output(qx,vce) $
vbct = v(base)-v(collector) $
re = 2 alpha/gm ie = ic+ib $
iet = ict + ibt vbet = v(base)-v(emitter) $
vcet = v(collector)-v(emitter) $
betadc = output(qx,betad) $
alpha = betadc/(betadc+1) $
gm = output(qx,gm)

TABLE VI

Example Diode Model d
Output Parameter Definitions cap = primitiveparameter(cap) vd = primitiveparameter(vd) $
id = primitiveparameter(i) id1 = 0 $
id2 = 0 vdt = 0 req = primitiveparameter(req) $ TABLE VI-continued Example Diode Model d
Output Parameter Definitions pwr=vdt*id1 bpwr=vd*id As may be seen by inspection of Tables II-VI, all user-defined output parameters for each model are defined either directly or indirectly in terms of primitive parameters generated by the circuit simulator.

Figure 8:
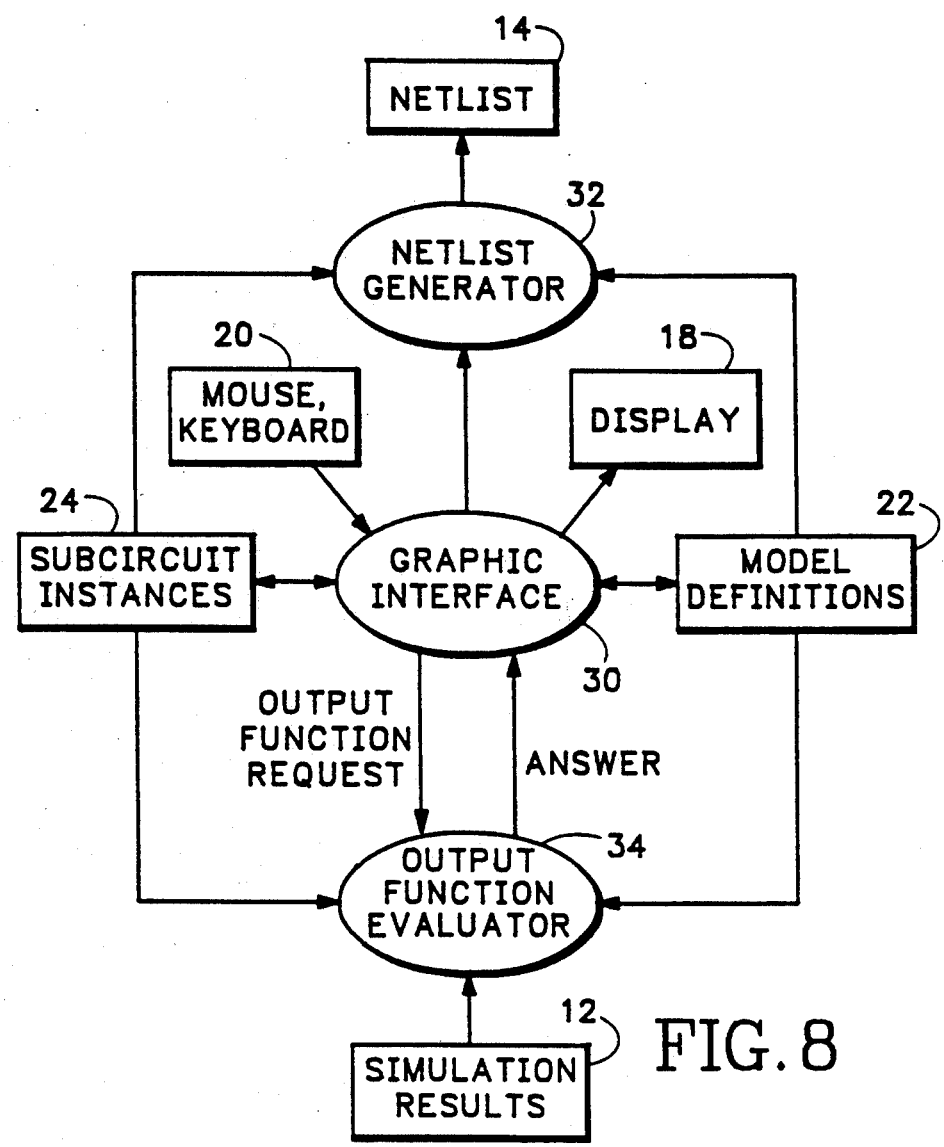
FIG. 8 illustrates data flow between subcomponents of the circuit simulator interface of FIG. 1.

FIG. 8 is a data flow diagram illustrating operation of the simulator interface 16 of FIG. 1 in more detail. The simulator interface includes three routines, a graphic interface 30, a netlist generator 32, and an output function evaluator 34. The graphic interface 30 receives all input from the mouse and keyboard 20, generates the display 18, and maintains and updates the model definitions files 22 and the subcircuit instances file 24 in response to user input.

When the user inputs a command to the graphic interface 30 to initiate circuit simulation, the graphic interface 30 sends a message to the netlist generator 32 indicating the circuit to be simulated. The netlist generator 32 reads data defining the circuit to be simulated out of the model definition and subcircuit instances files 22, 24, constructs the netlist 14 for the circuit, and passes the netlist to the circuit simulator.

As previously discussed, a user requests a pop-up menu displaying the various user-defined parameter values for a particular model instance by pointing to the instance with a cursor and depressing a mouse button. In response, the graphic interface 30 locates the appropriate output parameter definition file (one of model definition files 22) and constructs and displays a pop-up menu listing the output parameter names defined therein. When the user moves the cursor over one of the parameter names and releases the mouse button, the graphic interface 30 closes the pop-up menu. The graphic interface then obtains the appropriate output parameter expression out of the model definitions file 22 and transmits it to the output function evaluator 34.

The output function evaluator 34 decomposes the expression such that it includes only primitive parameters, consulting the model definition files 22 and the subcircuit instances files 24 as necessary to traverse the parameter definition hierarchy. As it determines primitive output parameter values included in the definition of the selected output parameter, the output function evaluator 34 reads these primitive output parameter values from simulation results file 12 and combines them in an appropriate manner to determine the value of the selected output parameter. The output function evaluator 34 then returns the resulting "answer" to the graphic interface 30 for display.

Figure 9:
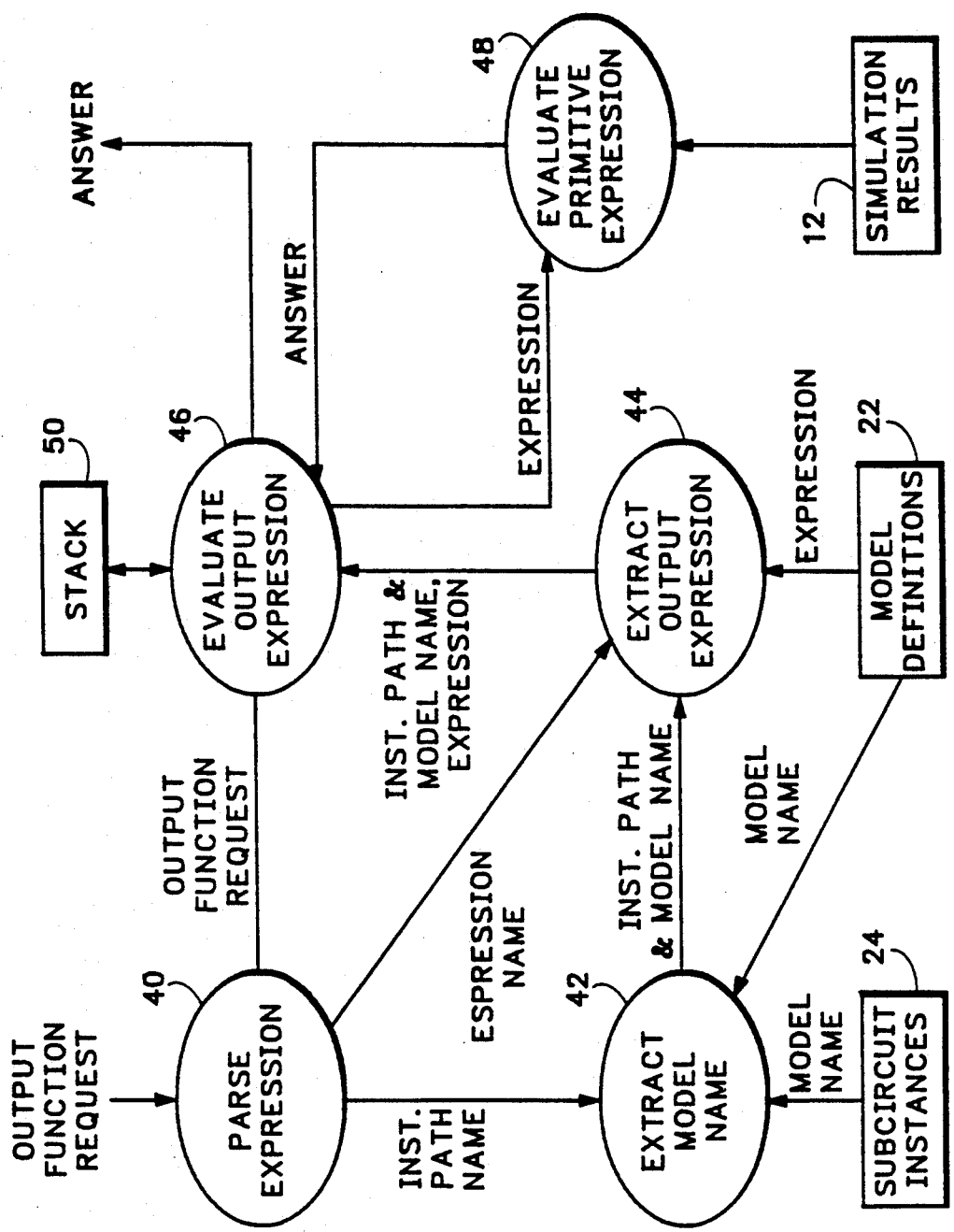
FIG. 9 illustrates data flow between subcomponents of the output function evaluator of FIG. 8.

FIG. 9 is a data flow diagram illustrating operation of the output function evaluator 34 in more detail. A "parse expression" routine 40 receives the output function request from the graphic interface, including the output expression to be evaluated. Assume, for example, that the user has requested the simulator interface to evaluate an "ics" output parameter associated with the diffPair1 subcircuit of FIG. 1. The graphic interface 30 of FIG. 8 sends an output function request to the parse expression routine 40 of FIG. 9 including the expression "output(diffpair1,ics)". The parse expression routine 40 decomposes this expression, sending the instance path name "diffPair1" to a "extract model name" routine 42 and sending the expression name "ics" to an "extract output expression" routine 44.

The extract model name routine 42 checks the subcircuit instances file 24 and finds diffPair1 is an instance of the diffPair model. It then forwards the path name diffpair1 and the model name diffPair to the extract output expression routine 44. The extract output expression routine 44 consults the model definitions file 22 and obtains the output expression for the ics output parameter, $$ics = output(q3,ie) + output(q4,ie) \quad [7]$$

The extract output expression routine 44 passes this expression, along with the instance path name diffPair1 to an "evaluate output expression" routine 46.

The ics expression [7] is the sum of two user-defined output parameters, output(q3,ie) and output(q4,ie). Routine 46 evaluates this expression term-by-term. First, routine 46 transmits another output function request to parse expression routine 40 including the expression output(q3,ie) and the instance path name diffPair1.q3 of transistor q3. The parse expression routine 40 passes the instance path name to the extract model name routine 42 and forwards the expression name ie to the extract output expression routine 44.

The extract model name routine 42 checks the subcircuit instances file 24 and finds diffPair1 is an instance of the diffPair model. It then checks the model definitions file 22 for the diffPair model and determines q3 is an instance of the subcircuit q model. It then forwards the path name diffPair1.q3 and the model name q to the extract output expression routine 44. The extract output expression routine 44 thereupon obtains the output expression $$ie = ic + ib \quad [8]$$

from the model definitions file 22 for the q subcircuit model and passes this expression, along with the instance path name diffPair1.q3 to the evaluate output expression routine 46.

The ie expression of equation [8] is the sum of two user-defined output parameters ic and ib. The evaluate output expression routine 46 stores the ie expression in stack 50 and transmits another output function request to parse expression routine 40 including expression name ic. The parse expression routine 40 passes this expression name to the extract output expression routine 44. Since the last model name q provided to the extract output expression routine referenced the model wherein the expression for output parameter ic is found, the parse expression routine 40 need not invoke the extract model name routine 42 to determine the model name. Instead, it requests the extract output expression routine to look up the expression for the ic parameter in the model definition file last accessed. The extract output express routine then extracts the expression $$ic = output(r8,bi) \quad [9]$$

and passes it to the evaluate output expression routine 46.

The ic expression has a single term output(r8,bi) and the evaluate output expression routine 46 transmits an output function request to parse expression routine 40 including path name diffPair1.q3.r8. Routine 40 also transmits the expression name bi to extract output expression routine 44. The extract model name routine 42 iteratively checks the subcircuit instances file 24 and the model definitions file and finds resistor r8 is an instance of resistor model r. It then forwards the path name diffPair1.q3.r8 and the model name r to the extract output expression routine 44. The extract output expression routine 44 consults the model definitions file 22, obtains the output expression for the bi parameter $$bi=bv/r \qquad [10]$$

and forwards this expression, along with the instance path name diffPair1.q3 r8 to evaluate output expression routine 46. Routine 46 stores the ics expression in stack 50 and transmits an output function request to parse expression routine 40 referencing the bv parameter.

The simulator interface continues to operate in a similar manner until the extract output expression routine subsequently returns the expression $$bv=primitivebv(1)-primitivebv(2) \qquad [11]$$

to the evaluate output expression routine 46, along with the path name diffPair1.q3.r8. This expression comprises only primitive parameter values. Therefore, the output expression routine 46 requests an evaluate primitive expression routine 48 to locate in the simulation results file 12 and return the value of the primitivebv(1) parameter for resistor diffPair1.q3.r8. When that value is returned, routine 46 stores it in stack 50. The evaluate output expression routing 46 then requests routine 48 to locate in file 12 and return the value of the primitivebv(2) parameter for resistor diffPair1.q3.r8. Now, having the received values of both terms of expression [10], the evaluate output expression routine calculates the value of parameter bv in accordance with expression [11].

Returning now to expression [10], routine 46 finds that it must obtain a value for the r parameter. It therefore transmits the expression name r to parse expression routine 40 which forwards it to output expression routine 44. The extract output expression routine 44 consults the resistor r model definitions file 22, obtains the output expression for the r parameter $$r=primitiveparameter(r) \qquad [12]$$

and forwards this expression, along with the instance path name diffPair1.q3.r8 to routine 46. Routine 46 then requests routine 48 to read and return the value of the r parameter for primitive resistor diffPair1.q3.r8. Knowing this value of r, routine 46 extracts the previously calculated value of bv from stack 50 and evaluates expression [10], storing in stack 50 the value of bi. Having now calculated and stored the value of bi in expression [10], routine 46 finds it may immediately evaluate ic per expression [9] since the value of ic is equal to the stored value of bi. It stores this value of ic in stack 50.

At this point, the evaluate output expression routine 46 knows the value of ic in expression [8] but does not know the value of ib. Therefore, it sends an output function request to parse expression routine 40 to find an expression for output parameter ib for the diffPair1.q3 transistor. Thereafter, routines 40-48 follow a procedure generally similar to the procedure used to determine the value of ic. Once routine 46 has determined the value of ib, it pulls the previously determined value of ic out of stack 50 and sums it with ib in accordance with expression [8] to find the value of ie for transistor instance diffPair1.q3. Routine 46 then stores this value in stack 50.

At this point, routine 46 has evaluated and stored the value of the first term "output(q3,ie)" of expression [7]. It then transmits an output function request to routine 40 requesting an expression for evaluating the second term output(q4,ie). Thereafter, routines 40-48 follow a procedure similar to that used to evaluate the output (q3, ie) term. When routine 46 at last determines the value of output parameter ie for transistor q4 of diffPair instance diffPair1, it extracts the value of the ie parameter for transistor q3 and adds the two parameter values in accordance with expression [7] to determine the value of output parameter ics. Routine 46 then returns this value for display by the graphic interface 30.

Thus, an improved circuit simulator interface in accordance with the present invention permits a user to define one or more output parameters associated with each subcircuit of a hierarchically-defined circuit. The user defines each output parameter as a combination of one or more primitive parameters produced by a simulator when simulating the circuit or other user-defined output parameter values. Once a circuit simulator has simulated the circuit and has generated the Primitive output parameter values, the simulator interface responds to a user request to display the value of a selected user-defined output parameter by decomposing the parameter expression defining the selected output parameter to an expression combining only primitive parameter values. The simulator interface evaluates the decomposed output parameter expression using primitive parameter values produced by the simulator and displays the result.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. For a circuit simulator responsive to input data for simulating operation of a circuit formed by interconnected instances of electronic devices having operating characteristics known to the circuit simulator, the circuit simulator generating values of primitive parameters representing behavior of the instances of electronic devices forming the circuit, said simulator input data describing the circuit as an arrangement of interconnected subcircuits, wherein each subcircuit is defined according to a multiple level subcircuit hierarchy as an arrangement of interconnected components, each component of a subcircuit being one of an instance of said electronic devices and an instance of another subcircuit, a simulator interface for generating and displaying values of output parameters representing behavior of subcircuit instances included in the description of said circuit, said simulator interface comprising:

means for storing a multiple level output parameter expression hierarchy, each level of said expression hierarchy corresponding to a separate level of said subcircuit hierarchy and comprising at least one user-defined expression defining an output parameter representing behavior of a subcircuit defined at the corresponding level of said subcircuit hierarchy, said at least one expression including at least one parameter representing behavior of a component of said subcircuit;

means for evaluating said at least one output parameter expression representing behavior of a component subcircuit of said circuit in accordance with said expression hierarchy and primitive parameter values generated by said circuit simulator to generate the output parameter; and means for displaying the output parameter.

2. The simulator interface in accordance with claim 1 further comprising means for generating said input data in response to user input.

3. The simulator interface in accordance with claim 1 further comprising:

means for displaying results of evaluating said at least one output parameter expression, and means for generating said input data in response to user input.

4. The simulator interface in accordance with claim 1 wherein said means for evaluating said one parameter expression comprises:

extracting means for returning a stored expression defining the output parameter in response to an input request identifying the output parameter; and evaluation means receiving the returned stored expression for recursively providing input requests to said extracting means identifying each output parameter included in said stored expressions, for obtaining from said circuit simulator values of primitive parameters included in returned expressions, and for combining the obtained primitive parameter values in accordance with said returned expressions to generate the output parameter.

5. For a circuit simulator simulating operation of a circuit comprising an arrangement of interconnected instances of electronic devices, the circuit simulator receiving input data defining the circuit to be simulated as an arrangement of interconnected instances of subcircuits, the subcircuits being defined according to a multiple level subcircuit hierarchy, wherein subcircuits at a lowest level of the subcircuit hierarchy are defined as arrangements of instances of interconnected electronic devices having operating behavior known to the circuit simulator, wherein subcircuits at higher levels of the subcircuit hierarchy are defined as arrangements of interconnected instances of subcircuits defined at lower levels of said subcircuit hierarchy, and wherein the circuit simulator generates values of primitive parameters representing behavior of the electronic devices forming the circuit in response to said input data, a simulator interface for generating and displaying values of output parameters representing behavior of subcircuit instances forming said circuit, comprising:

means for receiving and storing a multiple level, output parameter expression hierarchy, wherein each level of the expression hierarchy corresponds to a separate level of said subcircuit hierarchy and comprises at least one user-defined expression defining an output parameter representing behavior of a particular subcircuit defined at a corresponding level of said subcircuit hierarchy, said at least one expression including at least one other output or primitive parameter representing behavior of an instance of another subcircuit or electronic device included in a definition of said particular subcircuit at said corresponding level of said subcircuit hierarchy;

means for receiving values of primitive parameters generated by said circuit simulator and for evaluating an output parameter expression in accordance with the received primitive parameter values; and means for displaying a result of evaluating said output parameter expression.

6. In a circuit simulation system comprising a circuit simulator responsive to input data for simulating operation of a circuit formed by interconnected instances of electronic devices having operating characteristics known to the circuit simulator, the circuit simulator generating values of primitive parameters representing behavior of the instances of electronic devices forming the circuit, said simulator input data describing the circuit as an arrangement of interconnected subcircuits, wherein each subcircuit is defined according to a multiple level subcircuit hierarchy as an arrangement of interconnected components, each component of a subcircuit being an instance of one of said electronic devices and an instance of another subcircuit, said system further comprising display means and a computer controlling said display means and receiving primitive parameter values from said circuit simulator, a method for generating and displaying values of output parameters representing behavior of subcircuit instances included in the description of said circuit, the method comprising the steps of:

storing a multiple level output parameter expression hierarchy, each level corresponding to a separate level of said subcircuit hierarchy and comprising at least one user-defined expression defining an output parameter representing behavior of a subcircuit defined at the corresponding level of said subcircuit hierarchy, said at least one expression including at least one parameter representing behavior of a component of said subcircuit;

evaluating said at least one output parameter expression in accordance with said expression hierarchy and primitive parameter values generated by said circuit simulator to generate the output parameter; and displaying on said display means the results of evaluating said at least one output parameter expression.

7. A circuit simulation system comprising:

a circuit simulator responsive to input data for simulating operation of a circuit formed by interconnected instances of electronic devices having operating characteristics known to the circuit simulator, the circuit simulator generating values of primitive parameters representing behavior of the instances of electronic devices forming the circuit, said simulator input data describing the circuit as an arrangement of interconnected subcircuits, wherein each subcircuit is defined according to a multiple level subcircuit hierarchy as an arrangement of interconnected components, each component of a subcircuit being an instance of one of said electronic devices and an instance of another subcircuit;

means for storing a multiple level, user-defined output parameter expression hierarchy, each level corresponding to a separate level of said subcircuit hierarchy and comprising at least one expression defining an output parameter representing behavior of a subcircuit defined at the corresponding level of said subcircuit hierarchy, said at least one expression including at least one parameter representing behavior of a component of said subcircuit;

means for evaluating said at least one output parameter expression in accordance with said expression hierarchy and primitive parameter values generated by said circuit simulator to generate the output parameter; and means for displaying the output parameter.

8. The simulator system in accordance with claim 7 further comprising means for generating said input data in response to user input.

9. The circuit simulation system in accordance with claim 7 wherein said means for evaluating said at least one parameter expression comprises:

extracting means for returning a stored expression defining the output parameter in response to an input request identifying the output parameter; and evaluation means receiving the expression returned by said extracting means for recursively providing input requests to said extracting means identifying output parameters included in said stored expression, for obtaining from said circuit simulator values of primitive parameters included in returned expressions, and for combining the obtained primitive parameter values in accordance with said returned expressions to generate the output parameter.

* * * * *